United States Patent
Sakai

(10) Patent No.: US 10,261,414 B2
(45) Date of Patent: Apr. 16, 2019

(54) LIQUID SOLDER RESIST COMPOSITION AND PRINTED WIRING BOARD

(71) Applicant: GOO CHEMICAL CO., LTD., Kyoto (JP)

(72) Inventor: Yoshio Sakai, Shiga (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

(21) Appl. No.: 15/568,973

(22) PCT Filed: Oct. 12, 2016

(86) PCT No.: PCT/JP2016/004552
§ 371 (c)(1),
(2) Date: Oct. 24, 2017

(87) PCT Pub. No.: WO2017/158661
PCT Pub. Date: Sep. 21, 2017

(65) Prior Publication Data
US 2018/0129135 A1    May 10, 2018

(30) Foreign Application Priority Data

Mar. 16, 2016 (JP) ................................. 2016-052474

(51) Int. Cl.
H05K 3/28 (2006.01)
H05K 3/34 (2006.01)
G03F 7/004 (2006.01)
G03F 7/027 (2006.01)
G03F 7/031 (2006.01)
G03F 7/038 (2006.01)

(52) U.S. Cl.
CPC .............. *G03F 7/038* (2013.01); *G03F 7/004* (2013.01); *G03F 7/027* (2013.01); *G03F 7/031* (2013.01); *H05K 3/28* (2013.01); *H05K 3/287* (2013.01); *H05K 3/3457* (2013.01)

(58) Field of Classification Search
CPC .......... G03F 7/038; G03F 7/031; H05K 3/287
USPC ..................................................... 430/280.1
See application file for complete search history.

(56) References Cited

U.S. PATENT DOCUMENTS

| 5,753,722 A | 5/1998 | Itokawa et al. | |
|---|---|---|---|
| 2003/0129535 A1 | 7/2003 | Tzou | |
| 2013/0048357 A1* | 2/2013 | Ueta | H05K 3/287 174/258 |
| 2014/0147776 A1 | 5/2014 | Ito et al. | |

FOREIGN PATENT DOCUMENTS

| CN | 103492950 A | 1/2014 |
|---|---|---|
| EP | 0 323 563 A2 | 7/1989 |
| JP | 63-205649 A | 8/1988 |
| JP | 2-23351 A | 1/1990 |
| JP | 4-355451 A | 12/1992 |
| JP | 9-157574 A | 6/1997 |
| JP | 2000-321765 A | 11/2000 |
| JP | 2003-76009 A | 3/2003 |
| JP | 2007-322755 A | 12/2007 |
| JP | 20007-326933 A | 12/2007 |
| JP | 2009-47761 A | 3/2009 |
| JP | 2009-156949 A | 7/2009 |
| JP | 2010-224168 A | 10/2010 |
| JP | 2010-266556 A | 11/2010 |
| JP | 2010-276694 A | 12/2010 |
| JP | 2011-138037 A | 7/2011 |
| JP | 2012-78414 A | 4/2012 |
| JP | 2013-68867 A | 4/2013 |
| JP | 2014-6498 A | 1/2014 |
| JP | 2014-122360 A | 7/2014 |
| JP | 5643416 B1 | 12/2014 |
| JP | 2015-120841 A | 7/2015 |
| JP | 2015-121653 A | 7/2015 |

OTHER PUBLICATIONS

English translation of Written opinion of PCT application PCT/JP2016/004552, dated Dec. 27, 2016, 5 pages.*
Supplementary European Search Report for the Application No. EP 16 894 285.2 dated Feb. 27, 2018.
International Search Report for the Application No. PCT/JP2016/004552 dated Dec. 27, 2016.
International Search Report for the Application No. PCT/JP2016/004551 dated Dec. 27, 2016.
Notification of the First Office Action for the Application No. 201680024471.3 from The State Intellectual Property Office of the People's Republic of China dated Mar. 5, 2018.

* cited by examiner

*Primary Examiner* — Cynthia Hamilton
(74) *Attorney, Agent, or Firm* — Cheng Law Group, PLLC

(57) ABSTRACT

A liquid solder resist composition contains a carboxyl group-containing resin (A), a thermosetting component (B), a photopolymerizable component (C), a photopolymerization initiator (D), and a coloring agent (E). The thermosetting component (B) contains a powdery epoxy compound (B11) represented by following formula (1),

[Chemical 1]

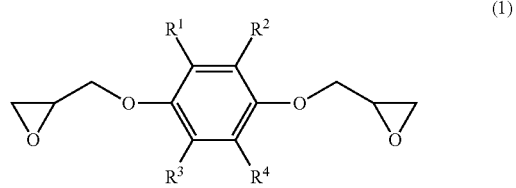

(1)

An amount of the epoxy compound (B11) with respect to a total amount of the carboxyl group-containing resin (A), the thermosetting component (B), and the photopolymerizable component (C) is within a range of 15 to 40 weight %.

5 Claims, No Drawings

LIQUID SOLDER RESIST COMPOSITION AND PRINTED WIRING BOARD

TECHNICAL FIELD

The present invention relates to liquid solder resist compositions and printed wiring boards, and specifically relates to: a liquid solder resist composition which has photocurability and can be developed with an alkaline solution; and a printed wiring board including a solder resist layer formed with the liquid solder resist composition.

BACKGROUND ART

In recent years, as a method for forming solder resist layers on printed wiring boards for consumer use and industrial use, a liquid solder resist composition with excellent resolution and dimensional accuracy which can be developed with an alkaline solution has been widely used, instead of a screen printing method, in order to increase the density of wiring on the printed wiring board.

A solder resist layer is sometimes required to have a matte surface, for example, in order to prevent solder bridging caused by solder adhering to the solder resist layer during reflow. Also, a solder resist layer of a printed wiring board mounting a light-emitting diode which has become widely used rapidly in recent years is sometimes required to be black and have a matte surface so that light emitted from the light-emitting diode can be perceived more brightly.

In order to make a surface of the solder resist layer matte, deglossing materials such as fine particles of silica, talc and kaolin are usually added to the solder resist composition (Patent Literature 1).

However, a large amount of the deglossing material is required to achieve a sufficiently matte surface using the deglossing material. Using a large amount of the deglossing material may lead to decrease in electric corrosion resistance of the solder resist layer, decrease in pressure cooker test resistance, and decrease in applicability caused by an increase in a thixotropic property of the solder resist composition.

CITATION LIST

Patent Literature

Patent Literature 1: JP H09-157574 A

SUMMARY OF INVENTION

The present invention aims to provide: a liquid solder resist composition in which a solder resist layer formed with the liquid solder resist composition can have a matte surface due to resin components in the liquid solder resist composition; and a printed wiring board including the solder resist layer which includes a cured product of the liquid solder resist composition.

A liquid solder resist composition according to one embodiment of the present invention contains a carboxyl group-containing resin (A), a thermosetting component (B), a photopolymerizable component (C), a photopolymerization initiator (D), and a coloring agent (E).

The thermosetting component (B) contains an epoxy compound (B1).

The epoxy compound (B1) contains a powdery epoxy compound (B11) represented by following formula (1).

[Chemical 1]

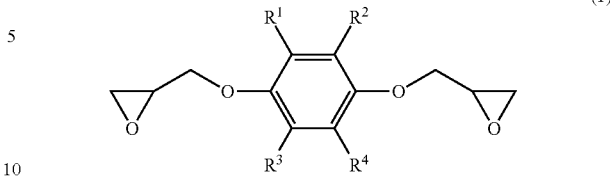

(1)

$R^1$, $R^2$, $R^3$, and $R^4$ in the formula (1) are independently a methyl group, a hydrogen atom, or a t-butyl group.

An amount of the epoxy compound (B11) with respect to a total amount of the carboxyl group-containing resin (A), the thermosetting component (B), and the photopolymerizable component (C) is within a range of 15 to 40 weight %.

An equivalent weight of epoxy groups in the epoxy compound (B1) with respect to 1 equivalent of carboxyl groups in the carboxyl group-containing resin (A) is within a range of 1.0 to 5.0 equivalent.

A printed wiring board according to one embodiment of the present invention includes a solder resist layer including a cured product of the liquid solder resist composition.

DESCRIPTION OF EMBODIMENTS

One embodiment for implementing the present invention is now described. It should be noted that in the description from now on, "(meth)acryl" means at least one of "acryl" and "methacryl". For example, (meth)acrylate means at least one of acrylate and methacrylate.

A liquid solder resist composition (hereinafter referred to as "composition (P)") according to the present embodiment is a liquid solder resist composition which can be used to form a solder resist layer on a printed wiring board.

The composition (P) contains a carboxyl group-containing resin (A), a thermosetting component (B), a photopolymerizable component (C), a photopolymerization initiator (D), and a coloring agent.

The thermosetting component (B) contains an epoxy compound (B1). The epoxy compound (B1) contains a powdery epoxy compound (B11) represented by following formula (1). An amount of the epoxy compound (B11) with respect to a total amount of the carboxyl group-containing resin (A), the thermosetting component (B), and the photopolymerizable component (C) is within a range of 15 to 40 weight %. Further, an equivalent weight of epoxy groups in the epoxy compound (B1) with respect to 1 equivalent of carboxyl groups in the carboxyl group-containing resin (A) is within a range of 1.0 to 5.0 equivalent.

[Chemical 2]

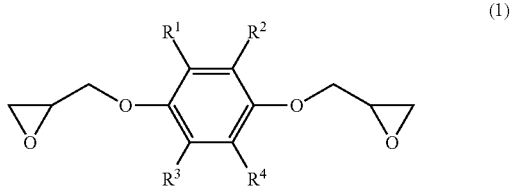

(1)

$R^1$, $R^2$, $R^3$, and $R^4$ in the formula (1) are independently a methyl group, a hydrogen atom, or a t-butyl group.

The composition (P) can be applied on a substrate and then dried to form a coating. The coating then can be partially exposed to light followed by a development process and if necessary further heating. Accordingly, the solder resist layer can be formed. This solder resist layer can have a matte surface especially due to the epoxy compound (B11) among resin components contained in the composition (P).

The reason that the solder resist layer can have a matte surface is considered as follows. Since the epoxy compound (B11) is powdery and has a high melting point of about 138 to 145° C., the epoxy compound (B11) tends not to mix with components in the composition (P) other than the epoxy compound (B11). Due to this, when the coating is formed with the composition (P) and the coating undergoes exposure to light followed by development, the epoxy compound (B11) tends to remain dispersed in the coating without mixing with the other components. Furthermore, when the coating is heated to form the solder resist layer, the epoxy compound (B11) first melts and then reacts with the carboxyl group-containing resin (A) and the like. At this time, since the epoxy compound (B11) is unlikely to move within the coating, sea-island structure in which parts of high concentration of a reaction product of the epoxy compound (B11) and the carboxyl group-containing resin (A) and the like are dispersed like islands is formed in the solder resist layer. Accordingly, it is considered that light incident on the solder resist layer is easily scattered, which results in a matte surface of the solder resist layer.

Components contained in the composition (P) are explained further in detail.

The carboxyl group-containing resin (A) can provide the coating formed with the composition (P) with developability in an alkaline solution, i.e., alkali developability.

The carboxyl group-containing resin (A) preferably contains a novolac-based carboxyl group-containing resin (A1) (hereinafter also referred to as a component (A1)). The component (A1) is a compound derived from novolac epoxy resin. When the carboxyl group-containing resin (A) contains the component (A1), the solder resist layer can have good heat resistance and moisture resistance.

The component (A1) contains, for example, a resin (k) which is a reaction product of: an intermediate product of a reaction between novolac epoxy resin (k1) and an ethylene-based unsaturated compound (k2) having a carboxyl group; and at least one kind of a compound (k3) selected from a group consisting of polycarboxylic acids and anhydrides thereof. The resin (k) is obtained by, for example, adding the compound (k3) to the intermediate product of the reaction between epoxy groups in the novolac epoxy resin (k1) and carboxyl groups in the ethylene-based unsaturated compound (k2).

The novolac epoxy resin (k1) contains at least one of, for example, cresol novolac epoxy resin and phenol novolac epoxy resin. The ethylene-based unsaturated compound (k2) preferably contains at least one of acrylic acid and methacrylic acid. The compound (k3) contains at least one kind of compound selected from a group consisting of, for example, polycarboxylic acids such as phthalic acid, tetrahydro phthalic acid, and methyl tetrahydro phthalic acid, and anhydrides of the polycarboxylic acids.

The carboxyl group-containing resin (A) may contain a compound other than the component (A1).

For example, the carboxyl group-containing resin (A) may contain a resin (l) which is a reaction product of: an intermediate product of a reaction between epoxy resin (l1) other than the novolac epoxy resin (k1) and an ethylene-based unsaturated compound (l2) having a carboxyl group; and at least one kind of a compound (l3) selected from a group consisting of polycarboxylic acids and anhydrides thereof.

The carboxyl group-containing resin (A) may contain an acryl copolymer-based carboxyl group-containing resin (A2) (hereinafter also referred to as a component (A2)). The component (A2) is a compound having a main chain including a copolymer of a monomer containing an acrylic compound.

The component (A2) may contain a compound (hereinafter also referred to as a component (A21)) which has a carboxyl group but is not photopolymerizable. The component (A21) contains, for example, a polymer of an ethylene-based unsaturated monomer including an ethylene-based unsaturated compound which has a carboxyl group. The ethylene-based unsaturated compound which has a carboxyl group may contain at least one kind of compound selected from a group consisting of, for example, acrylic acid, methacrylic acid, and ω-carboxyl-polycaprolactone (n≈2) monoacrylate. The ethylene-based unsaturated compound which has a carboxyl group may also contain a reaction product of a dibasic acid anhydride and a compound such as pentaerythritol triacrylate and pentaerythritol trimethacrylate. The ethylene-based unsaturated monomer may further contain an ethylene-based unsaturated compound which does not have any carboxyl groups such as 2-(meth)acryloyloxy ethyl phthalate, 2-(meth)acryloyloxy ethyl-2-hydroxy ethyl phthalate, straight or branched aliphatic (meth) acrylic acid esters, and alicyclic (meth)acrylic acid esters (which may contain unsaturated bonding partially in a carbon ring).

The component (A2) may also contain a compound (A22) (hereinafter also referred to as component (A22)) which has a carboxyl group and an ethylene-based unsaturated group. The carboxyl group-containing resin (A2) may contain the component (A22) only.

The component (A22) contains, for example, a resin (g) which is a reaction product of: an intermediate product of a reaction between a polymer (g1) of an ethylene-based unsaturated monomer containing an ethylene-based unsaturated compound (h) which has an epoxy group and an ethylene-based unsaturated compound (g2) having a carboxyl group; and at least one kind of compound (g3) selected from a group consisting of polycarboxylic acids and anhydrides thereof. The resin (g) is obtained by, for example, adding the compound (g3) to the intermediate product of the reaction between epoxy groups in the polymer (g1) and carboxyl groups in the ethylene-based unsaturated compound (g2).

The ethylene-based unsaturated compound (h) contains, for example, a compound (h1) having an epoxy group such as glycidyl (meth)acrylate. The ethylene-based unsaturated compound (h) may further contain a compound (h2) which does not have any epoxy groups such as 2-(meth)acryloyloxy ethyl phthalate. The ethylene-based unsaturated compound (g2) preferably contains at least one of acrylic acid and methacrylic acid. The compound (g3) contains one or more kinds of compounds selected from a group consisting of, for example, polycarboxylic acids such as phthalic acid, tetrahydro phthalic acid, and methyl tetrahydro phthalic acid, and anhydrides of the polycarboxylic acids.

The component (A22) may also contain a resin (i) which is a reaction product of a polymer (i1) of an ethylene-based unsaturated monomer containing an ethylene-based unsaturated compound (j) which has a carboxyl group and an ethylene-based unsaturated compound (i2) having an epoxy group. The ethylene-based unsaturated monomer may further contain an ethylene-based unsaturated compound which does not have any carboxyl groups. The resin (i) is obtained by reacting epoxy groups in the ethylene-based unsaturated compound (j) with some of carboxyl groups in the polymer (i1). The ethylene-based unsaturated compound (j) contains a compound such as, for example, acrylic acid, methacrylic acid, ω-carboxy-polycaprolactone (n≈2) monoacrylate, pentaerythritol triacrylate, and pentaerythritol trimethacrylate. The ethylene-based unsaturated compound which does not have any carboxyl groups contains a compound such as, for example, 2-(meth)acryloyloxy ethyl phthalate, 2-(meth)acryloyloxy ethyl-2-hydroxy ethyl phthalate, straight or branched aliphatic (meth)acrylic acid esters, and alicyclic (meth)acrylic acid esters (which may contain unsaturated bonding partially in a carbon ring). The ethylene-based unsaturated compound (i2) preferably contains glycidyl (meth)acrylate.

An acid value of the carboxyl group-containing resin (A) is preferably larger than or equal to 20 mgKOH/g, more preferably larger than or equal to 30 mgKOH/g, and further preferably larger than or equal to 60 mgKOH/g. The acid value of the carboxyl group-containing resin (A) is preferably less than or equal to 180 mgKOH/g, more preferably less than or equal to 165 mgKOH/g, and further preferably less than or equal to 150 mgKOH/g.

A weight average molecular weight of the carboxyl group-containing resin (A) is preferably within a range of 800 to 100000 and more preferably within a range of 1000 to 50000.

Note that the weight average molecular weight of the carboxyl group-containing resin (A) can be determined from the result of molecular weight measurement by gel permeation chromatography under following condition.
GPC device: SHODEX SYSTEM 11 manufactured by SHOWA DENKO K.K.,
Column: SHODEX KF-800P, KF-005, KF-003, KF-001 connected in series,
Mobile phase: THF,
Flow rate: 1 mL/min,
Column temperature: 45° C.,
Detector: RI,
Conversion: polystyrene.

An amount of the carboxyl group-containing resin (A) with respect to solid content of the composition (P) is preferably within a range of 5 to 85 weight %, more preferably within a range of 10 to 75 weight %, and further preferably within a range of 30 to 60 weight %. Note that the solid content of the composition (P) is defined as a total amount of all components included in the composition (P) except for volatilizing components such as solvents.

The thermosetting component (B) can provide the composition (P) with thermosettability. As mentioned above, the thermosetting component (B) contains the epoxy compound (B1), and the epoxy compound (B1) contains the powdery hydroquinone epoxy compound (B11).

Since the epoxy compound (B11) has only one aromatic ring per molecule, a long conjugated bond is less likely to occur in the solder resist layer even if the solder resist layer formed with the composition (P) containing the epoxy compound (B11) is decomposed due to heat or light. Furthermore, the hydroquinone epoxy compound does not contain a nitrogen atom or a sulfur atom. As a result, the solder resist layer tends not to discolor. In addition, since the epoxy compound (B11) is bifunctional and contains an ether bond, the solder resist layer has a reduced brittleness, leading to improved flexibility. Thus, the solder resist layer has suppressed occurrence of cracks caused by machine processing of the solder resist layer. Also, the solder resist layer has suppressed occurrence of heat cracks caused by a difference in thermal expansion coefficients of a substrate and the solder resist layer when the solder resist layer is heated.

Further, the epoxy compound (B11) has an aromatic ring and thus contributes to an improvement in heat resistance of the solder resist layer. In addition, a melting point of the epoxy compound (B11) is as high as about 138 to 145° C. Thus, when the composition (P) is heated at a relatively low temperature around 60 to 80° C. to form a coating, the carboxyl group-containing resin (A) and the epoxy compound (B11) are not easily reacted. Accordingly, the carboxyl group-containing resin (A) tends to remain unreacted in the coating. Therefore, high alkali developability can be ensured when developing the coating after exposure to light.

Also, since the epoxy compound (B11) has the high melting point, when the composition (P) contains the epoxy compound (B11), the coating formed with the composition (P) containing the epoxy compound (B11) has reduced tackiness.

Furthermore, when the coating after development is heated at an appropriate temperature, for example at 150° C., the hydroquinone epoxy compound (B11) in the coating easily softens or melts, which promotes a thermosetting reaction in the coating involving the hydroquinone epoxy compound (B11). Consequently, heat resistance of the solder resist layer is improved.

As mentioned above, the amount of the epoxy compound (B11) with respect to the total amount of the carboxyl group-containing resin (A), the thermosetting component (B), and the photopolymerizable component (C) is within a range of 15 to 40 weight %. When the amount of the epoxy compound (B11) with respect to the total amount of the carboxyl group-containing resin (A), the thermosetting component (B), and the photopolymerizable component (C) is larger than or equal to 15 weight %, the solder resist layer formed with the composition (P) can have a matte surface. In addition, when the amount of the epoxy compound (B11) with respect to the total amount of the carboxyl group-containing resin (A), the thermosetting component (B), and the photopolymerizable component (C) is less than or equal to 40 weight %, good developability of the coating formed with the composition (P) is ensured, and at the same time a good leveling property of the coating can also be ensured by preventing an increase in a thixotropic property of the composition (P). The amount of the epoxy compound (B11) with respect to the total amount of the carboxyl group-containing resin (A), the thermosetting component (B), and the photopolymerizable component (C) is more preferably within a range of 15 to 30 weight %.

Further, the equivalent weight of epoxy groups in the epoxy compound (B1) with respect to 1 equivalent of carboxyl groups in the carboxyl group-containing resin (A) is within a range of 1.0 to 5.0 equivalent. In this case, the solder resist layer formed with the composition (P) can have a matte surface, and at the same time the solder resist layer can have preferable properties such as good flexibility, heat crack resistance, heat resistance, electric corrosion resistance, plating resistance, adhesiveness to a core material, resistance to a pressure cooker test, and a leveling property. Furthermore, the coating formed with the composition (P) can have a good low-tackiness. The equivalent weight of epoxy groups in the epoxy compound (B1) with respect to 1 equivalent of carboxyl groups in the carboxyl group-containing resin (A) is more preferably within a range of 1.0 to 3.0 equivalent.

The epoxy compound (B11) may further contain an epoxy compound (B12) other than the epoxy compound (B11).

The epoxy compound (B12) preferably has at least two epoxy groups per molecule. The epoxy compound (B12) may be a hardly soluble epoxy compound and may be a generic soluble epoxy compound.

The epoxy compound (B12) may contain at least one kind of component selected from a group consisting of, for example, phenol novolac epoxy resin (EPICLON N-775 manufactured by DIC Corporation), cresol novolac epoxy resin (EPICLON N-695 manufactured by DIC Corporation), bisphenol A epoxy resin (jER1001 manufactured by Mitsubishi Chemical Corporation), bisphenol A-novolac epoxy resin (EPICLON N-865 manufactured by DIC Corporation), bisphenol F epoxy resin (jER4004P manufactured by Mitsubishi Chemical Corporation), bisphenol S epoxy resin (EPICLON EXA-1514 manufactured by DIC Corporation), bisphenol AD epoxy resin, biphenyl epoxy resin (YX4000 manufactured by Mitsubishi Chemical Corporation), biphenyl novolac epoxy resin (NC-3000 manufactured by Nippon Kayaku Co., Ltd.), hydrogenated bisphenol A epoxy resin (ST-4000D manufactured by Nippon Steel & Sumikin Chemical Co., Ltd.), naphthalene epoxy resin (EPICLON HP-4032, EPICLON HP-4700, EPICLON HP-4770 manufactured by DIC Corporation), tertiary butylcatechol epoxy resin (EPICLON HP-820 manufactured by DIC Corporation), dicyclopentadiene epoxy resin (EPICLON HP-7200 manufactured by DIC Corporation), adamantane epoxy resin (ADAMANTATE X-E-201 manufactured by Idemitsu Kosan Co., Ltd.), biphenylether epoxy resin (YSLV-80DE manufactured by Nippon Steel & Sumikin Chemical Co., Ltd.), special two-functional epoxy resin (YL7175-500 and YL7175-1000 manufactured by Mitsubishi Chemical Corporation; EPICLON TSR-960, EPICLON TER-601, EPICLON TSR-250-80BX, EPICLON 1650-75MPX, EPICLON EXA-4850, EPICLON EXA-4816, EPICLON EXA-4822, and EPICLON EXA-9726 manufactured by DIC Corporation; YSLV-120TE manufactured by Nippon Steel & Sumikin Chemical Co., Ltd.), and bisphenol epoxy resins excluding the above.

The epoxy compound (B12) may contain triglycidyl isocyanurate. The triglycidyl isocyanurate especially preferably contains a β isomer in which three epoxy groups are located on the same side with respect to a flat s-triazine ring, or preferably contains a mixture of a β isomer and an α isomer in which one epoxy group is located on the different side from other two epoxy groups with respect to a flat s-triazine ring.

Note that, in order to especially effectively suppress discoloration of the solder resist layer as well as to effectively suppress brittleness of the solder resist layer and to provide the solder resist layer with the flexibility, the epoxy compound (B12) preferably does not contain the triglycidyl isocyanurate, i.e., the composition (P) preferably does not contain the triglycidyl isocyanurate.

The epoxy compound (B12) also preferably contains a phosphorus-containing epoxy resin. In this case, flame retardancy of the cured product of the solder resist composition is improved. Examples of the phosphorus-containing epoxy resin may include phosphoric acid-modified bisphenol F epoxy resin (EPICLON EXA-9726 and EPICLON EXA-9710 manufactured by DIC Corporation) and Epotohto FX-305 manufactured by Nippon Steel & Sumikin Chemical Co., Ltd.

The epoxy compound (B12) preferably contains a compound having a melting point or softening point higher than or equal to 60° C. In this case, tackiness of the coating formed with the composition (P) is reduced. The compound more preferably has the melting point or softening point within a range of 64 to 160° C. Specific examples of the compound may include phenol novolac epoxy resin (EPICLON N-775 manufactured by DIC Corporation, softening point of 70 to 80° C.), cresol novolac epoxy resin (EPICLON N-665 manufactured by DIC Corporation, softening point of 64 to 72° C.), bisphenol A epoxy resin (jER1001 manufactured by Mitsubishi Chemical Corporation, softening point of 64° C.), bisphenol A-novolac epoxy resin (EPICLON N-865 manufactured by DIC Corporation, softening point of 64 to 82° C.), bisphenol F epoxy resin (jER4004P manufactured by Mitsubishi Chemical Corporation, softening point of 85° C.), bisphenol S epoxy resin (EPICLON EXA-1514 manufactured by DIC Corporation, softening point of 75° C.), biphenyl epoxy resin (YX4000 manufactured by Mitsubishi Chemical Corporation, melting point of 105° C.), hydrogenated bisphenol A epoxy resin (ST-4000D manufactured by Nippon Steel & Sumikin Chemical Co., Ltd., softening point of 85 to 100° C.), naphthalene epoxy resin (EPICLON HP-4700, softening point of 85 to 95° C., EPICLON HP-4770, softening point of 67 to 77° C., manufactured by DIC Corporation), biphenylether epoxy resin (YSLV-80DE manufactured by Nippon Steel & Sumikin Chemical Co., Ltd., melting point of 83° C.), special two-functional epoxy resin (YSLV-120TE manufactured by Nippon Steel & Sumikin Chemical Co., Ltd., melting point of 118° C.), and triglycidyl isocyanurate (1,3,5-tris(2,3-epoxypropyl)-1,3,5-triazine-2,4,6(1H,3H,5H)-trione, melting point of 156° C.).

The thermosetting component (B) may contain the epoxy compound (B1) only; however, the thermosetting component (B) may contain a compound such as a thermosetting monomer and a thermosetting prepolymer other than the epoxy compound (B1). For example, the thermosetting component (B) may contain at least one kind of compound selected from a group consisting of polyimide resin, polyamide imide resin, triazine resin, phenol resin, melamine resin, urea resin, silicon resin, polyester resin, cyanate ester resin, and modified resins thereof.

The photopolymerizable component (C) contains at least one of, for example, a monomer (C1) having an ethylene-based unsaturated group and a prepolymer (C2) having an ethylene-based unsaturated group. Note that components included in the carboxyl group-containing resin (A) are excluded from the photopolymerizable component (C).

The monomer (C1) may contain at least one kind of compound selected from a group consisting of: for example, monofunctional (meth)acrylates such as 2-hydroxyethyl (meth)acrylate; and polyfunctional (meth)acrylates such as diethylene glycol di(meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, ε-caprolactone-modified pentaerythritol hexaacrylate, and tricyclodecane dimethanol di(meth)acrylate.

The photopolymerizable component (C) may contain a trifunctional compound which has three unsaturated bonds per molecule. The trifunctional compound may contain at least one kind of compound selected from a group consisting of, for example, trimethylol propane tri(meth)acrylate, EO-modified trimethylol propane tri(meth)acrylate, pentaerythritol tri(meth)acrylate, ethoxylated isocyanuric acid tri (meth)acrylate, ε-caprolactone-modified tris-(2-acryloyloxyethyl) isocyanurate, and ethoxylated glycerin tri(meth)acrylate.

The monomer (C1) may contain a phosphorus-containing compound (a phosphorus-containing unsaturated compound). In this case, flame retardancy of the cured product of the composition (P) is improved. The phosphorus-containing unsaturated compound may contain at least one kind of compound selected from a group consisting of, for example, 2-methacryloyloxy ethyl acid phosphate (for example, Light Ester P-1M and Light Ester P-2M manufactured by Kyoeisha Chemical Co., Ltd.), 2-acryloyloxy ethyl acid phosphate (for example, Light Acrylate P-1A manufactured by Kyoeisha Chemical Co., Ltd.), diphenyl-2-methacryloyloxy ethyl phosphate (for example, MR-260 manufactured by Daihachi Chemical Industry Co., Ltd.), and HFA series manufactured by Showa Highpolymer K. K. (for example, HFA-6003 and HFA-6007 which are products of an addition reaction of dipentaerythritol hexaacrylate and HCA (9,10-dihydro-9-oxa-10-phosphaphenanthrene-10-oxide) and HFA-3003 and HFA-6127 which are products of an addition reaction of caprolactone-modified dipentaerythritol hexaacrylate and HCA (9,10-dihydro-9-oxa-10-phosphaphenanthrene-10-oxide).

The prepolymer (C2) may contain at least one of: for example, a prepolymer obtained by adding an ethylene-based unsaturated group to polymerized monomers having ethylene-based unsaturated bonds; and an oligo (meth)acrylate prepolymer-based compound. The oligo (meth)acrylate prepolymer-based compound may contain at least one kind of compound selected from a group consisting of, for example, epoxy (meth)acrylate, polyester (meth)acrylate, urethane (meth)acrylate, alkyd resin (meth)acrylate, silicone resin (meth)acrylate, and spiran resin (meth)acrylate.

An amount of the photopolymerizable component (C) with respect to an amount of the carboxyl group-containing resin (A) is preferably within a range of 1 to 50 weight %, more preferably within a range of 10 to 45 weight %, and further preferably within a range of 21 to 40 weight %.

The photopolymerization initiator (D) may contain known materials. For example, the photopolymerization initiator (D) may contain one or more kinds of compounds selected from a group consisting of: for example, benzoins and alkylethers thereof; acetophenone-based compounds such as acetophenone and benzyldimethyl ketal; anthraquinone-based compounds such as 2-methylanthraquinone; thioxanthone-based compounds such as 2,4-dimethylthioxanthone, 2,4-diethylthioxanthone, 2-isopropylthioxanthone, 4-isopropylthioxanthone, and 2,4-diisopropylthioxanthone; benzophenone-based compounds such as benzophenone and 4-benzoyl-4'-methyldiphenylsulfide; xanthone-based compounds such as 2,4-diisopropylxanthone; nitrogen atom-containing compounds such as 2-methyl-1-[4-(methylthio)phenyl]-2-morpholino-1-propanone; α-hydroxy alkylphenone-based compounds such as 1-hydroxy-cyclohexyl-phenyl-ketone, 2-hydroxy-2-methyl-1-phenyl-propan-1-one, 1-[4-(2-hydroxy ethoxy)-phenyl]-2-hydroxy-2-methyl-1-propan-1-one, 2-hydroxy-1-{4-[4-(2-hydroxy-2-methyl-propyonyl)-benzyl]phenyl}-2-methyl-propan-1-one, and phenyl glyoxylic acid methyl ester; α-amino alkylphenone-based compounds such as 2-methyl-1-(4-methyl thiophenyl)-2-morpholino propan-1-one, 2-benzyl-2-dimethylamino-1-(4-morpholinophyenyl)-butanone-1, and 2-(dimethylamino)-2-[(4-methylphenyl)methyl]-1-[4-(4-morpholinyl)phenyl]-1-butanone; monoacylphosphine oxide-based photopolymerization initiators such as 2,4,6-trimethylbenzoyl-diphenyl-phosphine oxide, and 2,4,6-trimethylbenzoyl-ethyl-phenyl-phosphinate; acylphosphine-based photopolymerization initiators such as bis-(2,4,6-trimethylbenzoyl)phenylphosphine oxide, bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, and (2,5,6-trimethylbenzoyl)-2,4,4-trimethylpentylphosphine oxide; and oxime ester-based photopolymerization initiators such as 1,2-octanedione, 1-[4-(phenylthio)-, 2-(O-benzoyloxime)], and ethanone, 1-[9-ethyl-6-(2-methylbenzoyl)-9H-carbazole-3-yl]-, 1-(O-acetyloxime).

The photopolymerization initiator (D) preferably contains a bisacylphosphine oxide-based photopolymerization initiator and an α-hydroxy alkylphenone-based photopolymerization initiator. In this case, the coating formed with the composition (P) can be thoroughly cured from its surface to its deep part when exposed to light. In a case where the photopolymerization initiator (D) contains the bisacylphosphine oxide-based photopolymerization initiator and the α-hydroxy alkylphenone-based photopolymerization initiator and does not contain a monoacylphosphine oxide-based photopolymerization initiator, curability of the coating in its deep part under exposure to light becomes especially high. A total amount of the bisacylphosphine oxide-based photopolymerization initiator and the α-hydroxy alkylphenone-based photopolymerization initiator with respect to an amount of the photopolymerization initiator (D) is preferably within a range of 5 to 100 weight %, more preferably within a range of 7 to 100 weight %, further preferably within a range of 9 to 100 weight %, and especially preferably within a range of 70 to 100 weight %. An amount of the bisacyiphosphine oxide-based photopolymerization initiator with respect to the total amount of the bisacylphosphine oxide-based photopolymerization initiator and the α-hydroxy alkylphenone-based photopolymerization initiator is preferably within a range of 1 to 99 weight %, more preferably within a range of 5 to 60 weight %, and further preferably within a range of 10 to 40 weight %.

The photopolymerization initiator (D) also preferably contains an acylphosphine oxide-based photopolymerization initiator and a phenyl glyoxylate-based photopolymerization initiator. In this case, the coating formed with the composition (P) can be thoroughly cured from its surface to its deep part easily when exposed to light A total amount of the acylphosphine oxide-based photopolymerization initiator and the phenyl glyoxylate-based photopolymerization initiator with respect to the amount of the photopolymerization initiator (D) is preferably within a range of 3 to 100 weight %, more preferably within a range of 6 to 100 weight %, further preferably within a range of 9 to 100 weight %, and especially preferably within a range of 50 to 100 weight %. An amount of the acylphosphine oxide-based photopolymerization initiator with respect to the total amount of the acylphosphine oxide-based photopolymerization initiator and the phenyl glyoxylate-based photopolymerization initiator is preferably within a range of 1 to 99 weight %, more preferably within a range of 5 to 60 weight %, and further preferably within a range of 10 to 40 weight %.

The amount of the photopolymerization initiator (D) with respect to the amount of the carboxyl group-containing resin (A) is preferably within a range of 0.1 to 30 weight % and further preferably within a range of 1 to 25 weight %.

The composition (P) may further contain a known photopolymerization promotor and a known sensitizer. For example, the composition (P) may contain at least one kind of compound selected from a group consisting of: benzoins and alkylethers thereof; acetophenone-based compounds such as acetophenone and benzyldimethyl ketal; anthraquinone-based compounds such as 2-methylanthraquinone; thioxanthone-based compounds such as 2,4-dimethylthioxanthone, 2,4-diethylthioxanthone, 2-isopropylthioxanthone, 4-isopropylthioxanthone, and 2,4-diisopropylthioxanthone; benzophenone-based compounds such as benzophenone and 4-benzoyl-4'-methyldiphenylsulfide; xanthone-based compounds such as 2,4-diisopropylxanthone; α-hydroxy ketone-based compounds such as 2-hydroxy-2-methyl-1-phenyl-propan-1-one; nitrogen atom-containing compounds such as 2-methyl-1-[4-(methylthio)phenyl]-2-morpholino-1-propanone. The composition (P) may contain a known tertiary amine-based photopolymerization promotor and a known tertiary amine-based sensitizer such as p-dimethylbenzoic acid ethylester, p-dimethylaminobenzoic acid isoamyl ester, and 2-dimethylaminoethyl benzoate, in addition to the photopolymerization initiator (D). If necessary, the composition (P) may contain at least one kind of photopolymerization initiator selected from a group consisting of photopolymerization initiators for visible light exposure and photopolymerization initiators for near-infrared exposure. The composition (P) may contain a compound such as: a coumarin derivative, such as 7-diethyl amino-4-methylcoumarin, which is a sensitizer for laser exposure; a carbocyanine dye; and a xanthene dye, in addition to the photopolymerization initiator (D).

The composition (P) contains the coloring agent (E). The coloring agent (E) may contain at least one kind of component selected from a group consisting of, for example, a red coloring agent, a blue coloring agent, a green coloring agent, a yellow coloring agent, a purple coloring agent, an orange coloring agent, a brown coloring agent, and a black coloring agent (E1).

Examples of the red coloring agent may include monoazo-based compounds, disazo-based compounds, azo lake-based compounds, benzimidazolone-based compounds, perylene-based compounds, diketo pyrrolo pyrrole-based compounds, condensed azo-based compounds, anthraquinone-based compounds, and quinacridone-based compounds.

Examples of the blue coloring agent may include phthalocyanine-based compounds and anthraquinone-based compounds.

Examples of the green coloring agent may include phthalocyanine-based compounds, anthraquinone-based compounds, and perylene-based compounds.

Examples of the yellow coloring agent may include monoazo-based compounds, disazo-based compounds, condensed azo-based compounds, benzimidazolone-based compounds, isoindolinone-based compounds, and anthraquinone-based compounds.

Examples of the black coloring agent (E1) may include carbon black, naphthalene black, and perylene.

Especially when the coloring agent (E) contains the black coloring agent (E1), i.e. when the composition (P) contains the black coloring agent (E1), a black solder resist layer having a matte surface can be formed with the composition (P). In this case, light emitted from a light-emitting diode mounted on the printed wiring board including the black solder resist layer can be perceived more brightly due to the black solder resist layer. Further, the black coloring agent (E1) preferably contains the perylene. In this case, the black coloring agent (E1) is less likely to inhibit curing of the composition (P) while the composition (P) is exposed to light. Accordingly, even though the composition (P) contains the black coloring agent (E1), the composition (P) can have good photocurability. Due to this, the composition (P) can have high developability.

An amount of the coloring agent (E) with respect to the total amount of the carboxyl group-containing resin (A), the thermosetting component (B), and the photopolymerizable component (C) is preferably within a range of 0 to 10 weight %, more preferably within a range of 0.1 to 10 weight %, and further preferably within a range of 0.1 to 5 weight %.

The composition (P) may contain a component (F) which contains at least one of melamine and a melamine derivative. In this case, adhesiveness between the cured product of the composition (P) and metal such as copper increases. Due to this, the composition (P) is especially suitable as an insulating material for printed wiring boards. Also, plating resistance, i.e. whitening resistance during electroless nickel/gold plating treatment of the cured product of the composition (P) is improved.

The melamine is 2,4,6-triamino-1,3,5-triazine and is commercially available. The melamine derivative is preferably a compound which has a triazine ring and an amino group per molecule. Examples of the melamine derivative may include: guanamine; acetoguanamine; benzoguanamine; S-triazine derivatives such as 2,4-diamino-6-methacryloyloxy ethyl-S-triazine, 2-vinyl-4,6-diamino-S-triazine, 2-vinyl-4,6-diamino-S-triazine/isocyanuric acid adduct, and 2,4-diamino-6-methacryloyloxy ethyl-S-triazine/isocyanuric acid adduct; and a reaction product between melamine and an acid anhydride, such as melamine-tetrahydro phthalate. More specific examples of the melamine derivative may include VD-1, VD-2, and VD-3 manufactured by SHIKOKU CHEMICALS CORPORATION.

When the composition (P) contains the component (F), an amount of the component (F) with respect to the amount of the carboxyl group-containing resin (A) is preferably within a range of 0.1 to 10 weight % and further preferably within a range of 0.5 to 5 weight %.

It is preferable that the composition (P) does not contain any deglossing materials or contains a deglossing material at an amount of less than or equal to 12 weight % with respect to the total amount of the carboxyl group-containing resin (A), the thermosetting component (B), and the photopolymerizable component (C). Even in these cases, the solder resist layer formed with the composition (P) can have a sufficiently matte surface. Also, when the composition (P) contains the deglossing material, a deglossing effect on a surface of the solder resist layer further increases. Furthermore, when the composition (P) does not contain any deglossing materials or contains the deglossing material only at the amount of less than or equal to 12 weight % with respect to the total amount of the carboxyl group-containing resin (A), the thermosetting component (B), and the photopolymerizable component (C), good electric corrosion resistance and pressure cooker test resistance of the solder resist layer are ensured, and at the same time a thixotropic property of the composition (P) is prevented from increasing which does not impair good applicability.

The deglossing material is a filler having a property of making a surface of the solder resist layer matte and is usually in a form of porous particles. Examples of the deglossing material may include fine particle silica, aluminum silicate, fine particle polyethylene, fine particle acryl, talc, and kaolin. It is preferable that the composition (P) does not contain fine particle silica, aluminum silicate, fine particle polyethylene, fine particle acryl, talc, and kaolin or contains fine particle silica, aluminum silicate, fine particle polyethylene, fine particle acryl, talc, and kaolin only at the amount of less than or equal to 12 weight % in total with respect to the total amount of the carboxyl group-containing resin (A), the thermosetting component (B), and the photopolymerizable component (C).

The composition (P) may contain an inorganic filler other than the deglossing material. In this case, shrinkage of the coating formed with the composition (P) during curing can be reduced, and at the same time the solder resist layer can have high hardness and the solder resist layer can further have adhesiveness to metal. The inorganic filler may contain at least one kind of compound selected from a group consisting of: for example, barium sulfate, crystalline silica, nano silica, carbon nanotube, bentonite, aluminum hydroxide, and magnesium hydroxide. An amount of the inorganic filler with respect to the amount of the carboxyl group-containing resin (A) is, for example, within a range of 0 to 300 weight %.

The composition (P) may contain an organic solvent. The organic solvent is used to liquefy the composition (P) or form varnish with the composition (P), and to adjust viscosity, applicability, and film-formability.

The organic solvent may contain at least one kind of compound selected from a group consisting of: for example, straight, branched, secondary, or poly alcohols such as ethanol, propyl alcohol, isopropyl alcohol, hexanol, and ethylene glycol; ketones such as methyl ethyl ketone and cyclohexanone; aromatic hydrocarbons such as toluene and xylene; petroleum aromatic mixed solvents such as Swazol series (manufactured by Maruzen Petrochemical Co., Ltd.) and Solvesso series (manufactured by Exxon Mobil Chemical Corporation); cellosolve-based compounds such as cellosolve and butyl cellosolve; carbitol-based compounds such as carbitol and butyl carbitol; propylene glycol alkyl ether-based compounds such as propylene glycol methyl ether; polypropylene glycol alkyl ether-based compounds such as dipropylene glycol methyl ether; acetic acid ester-based compounds such as ethyl acetate, butyl acetate, cellosolve acetate, and carbitol acetate; and dialkyl glycol ether-based compounds.

An amount of each component in the composition (P) is appropriately adjusted so that the composition (P) has photocurability and is developable with an alkaline solution.

In a case where the composition (P) contains the organic solvent, an amount of the organic solvent is preferably adjusted so that the organic solvent volatilizes quickly when the coating formed with the composition (P) is dried, i.e. the organic solvent does not remain in the dried coating. Especially, the amount of the organic solvent with respect to the entire composition (P) is preferably within a range of 0 to 99.5 weigh t %, and further preferably within a range of 15 to 60 weight %. Note that, since an appropriate amount of the organic solvent depends on a coating method, the amount of the organic solvent is preferably adjusted appropriately depending on the coating method.

The composition (P) may further contain components other than the above, as long as the effects of the present embodiment are not impaired.

For example, the composition (P) may contain an antioxidant. The antioxidant contributes to curing of the solder resist layer from its surface to its deep part and further to an improvement in adhesiveness as well as to an improvement in heat discoloration resistance of the solder resist layer.

A melting point of the antioxidant is preferably within a range of 50 to 150° C. In this case, bleedout of the antioxidant from the coating formed with the solder resist composition can be prevented. Also, crystals of the antioxidant are prevented from precipitating. Accordingly, surface evenness of the solder resist layer is improved.

The antioxidant may contain at least one kind of compound selected from a group consisting of, for example, hindered phenol-based antioxidants such as: IRGANOX 245 (melting point of 76 to 79° C.), IRGANOX 259 (melting point of 104 to 108° C.), IRGANOX 1035 (melting point of 63 to 67° C.), IRGANOX 1098 (melting point of 156 to 161° C.), IRGANOX 1010 (melting point of 110 to 125° C.), IRGANOX 1076 (melting point of 50 to 55° C.), and IRGANOX 1330 (melting point of 240 to 245° C.) manufactured by BASF Corporation; ADEKA STAB AO-20 (melting point of 220 to 222° C.), ADEKA STAB AO-30 (melting point of 183 to 185° C.), ADEKA STAB AO-40 (melting point of 210 to 214° C.), ADEKA STAB AO-50 (melting point of 51 to 54° C.), ADEKA STAB AO-60 (melting point of 110 to 130° C.), ADEKA STAB AO-80 (melting point of 110 to 120° C.), and ADEKA STAB AO-330 (melting point of 243 to 245° C.) manufactured by ADEKA CORPORATION; SEENOX224M (melting point of 129 to 132° C.) and SEENOX326M (melting point of 241 to 249° C.) manufactured by SHIPRO KASEI KAISHA, Ltd.; SUMILIZER GA-80 (melting point of higher than or equal to 110° C.) and SUMILIZER MDP-S (melting point of higher than or equal to 128° C.) manufactured by Sumitomo Chemical CO., Ltd.; and Antage BHT (melting point of higher than or equal to 69° C.), Antage W-300 (melting point of higher than or equal to 205° C.), Antage W-400 (melting point of higher than or equal to 120° C.), and Antage W-500 (melting point of higher than or equal to 120° C.) manufactured by Kawaguchi Chemical Industry Co., LTD. Especially, the antioxidant preferably contains IRGANOX 1010 (melting point of 110 to 125° C.).

The composition (P) may contain at least one kind of resin selected from a group consisting of: blocked isocyanates of tolylene diisocyanate, morpholine diisocyanate, isophorone diisocyanate, and hexamethylene diisocyanate which are blocked with caprolactam, oxime, maleic acid ester, and the like; resin obtained by adding (meth)acrylic acid to epoxy resin such as bisphenol A epoxy resin, phenol novolac epoxy resin, cresol novolac epoxy resin, and alicyclic epoxy resin; and polymeric compounds such as diallyl phthalate resin, phenoxy resin, urethane resin, and fluorine resin.

The composition (P) may contain a curing agent to cure the epoxy compound (B1). The curing agent may contain at least one kind of compound selected from a group consisting of: for example, imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid hydrazide and sebacic acid hydrazide; phosphorus compounds such as triphenylphosphine; acid anhydrides; phenols; mercaptans; Lewis acid amine complexes; and onium salts. Examples of commercial products of the above compounds may include 2MZ-A, 2MZ-OK, 2PHZ, 2P4BHZ, and 2P4MHZ manufacture by Shikoku Chemicals Corporation (product names for commercial products of imidazole-based compounds), U-CAT3503N and U-CAT3502T manufactured by San-Apro Ltd. (product names for commercial products of blocked isocyanates of dimethylamine), and DBU, DBN, U-CATSA102, and U-CAT5002 manufactured by San-Apro Ltd. (bicyclic amidine compounds and salts thereof).

The composition (P) may contain an adhesiveness-imparting agent other than the component (F). Examples of the adhesiveness-imparting agent may include guanamine, acetoguanamine, benzoguanamine, and S-triazine derivatives such as 2,4-diamino-6-methacryloyloxyethyl-S-triazine, 2-vinyl-4,6-diamino-S-triazine, 2-vinyl-4,6-diamino-S-triazine/isocyanuric acid adduct, and 2,4-diamino-6-methacryloyloxyethyl-S-triazine/isocyanuric acid adduct.

The composition (P) may contain at least one kind of compound selected from a group consisting of: a curing promotor; a copolymer such as silicones and acrylates; a leveling agent; an adhesiveness-imparting agent such as silane coupling agents; a thixotropy agent; a polymerization inhibitor, a halation preventer; a flame retardant; a defoamer; an antioxidant; a surfactant; and a polymer dispersant.

An amount of the amine compound in the composition (P) is preferably as small as possible. In this case, an electric insulation property of a layer including the cured product of the composition (P) is unlikely to be impaired. Especially, the amount of the amine compound with respect to the amount of the carboxyl group-containing resin (A) is preferably less than or equal to 6 weight % and further preferably less than or equal to 4 weight %.

Ingredients as described above for the composition (P) are combined and kneaded by a known kneading method using, for example, a three-roll, a ball mill, or a sand mill to obtain the composition (P). When the ingredients of the composition (P) include components that are liquid or have low viscosity, ingredients excluding the components that are liquid or have low viscosity may be first kneaded, and then the components that are liquid or have low viscosity may be added to the kneaded mixture to obtain the composition (P).

In regard to preservation stability, some of the ingredients of the composition (P) may be mixed to obtain a first mixture, and the rest of the ingredients may be mixed to obtain a second mixture. That is, the composition (P) may include the first mixture and the second mixture. For example, the photopolymerizable component (C), some of the organic solvent, and the thermosetting component (B) out of all the ingredients of the composition (P) may be mixed and dispersed in advance to obtain the first mixture, and the rest of the ingredients of the composition (P) may be mixed and dispersed to obtain the second mixture. In this case, required amounts of the first mixture and the second mixture may be mixed to obtain a mixture which is used to form the solder resist layer.

An example of a method to obtain a printed wiring board including the solder resist layer formed with the composition (P) is explained.

First, a core material is prepared. The core material includes, for example, at least one insulating layer and at least one conductive wiring. The coating is formed with the composition (P) on a surface of the core material on which the conductive wiring is formed. An application method is preferably employed as a method for forming the coating. In this case, the solder resist layer can have a more matte surface. In the application method, for example, the composition (P) is applied on the core material to form a wet coating. The application method for applying the composition (P) is selected from a group consisting of known methods such as, for example, a dipping method, a spray method, a spin coating method, a roll coating method, a curtain coating method, and a screen printing method. Subsequently, in order for the organic solvent in the composition (P) to volatilize, the wet coating is dried at a temperature, for example, within a range of 60 to 120° C. to obtain the coating.

The coating is exposed to light for partial curing. For exposure to light, for example, a negative mask is placed on the coating and then the coating is irradiated with ultra violet rays. The negative mask includes an exposed part, which transmits the ultra violet rays, and an unexposed part, which does not transmit the ultra violet rays. For example, photo tools such as a mask film and a dry plate are used as the negative mask. A light source for the ultra violet rays is selected from a group consisting of, for example, a chemical lamp, a low pressure mercury lamp, a medium pressure mercury lamp, a high pressure mercury lamp, an ultra-high pressure mercury lamp, a xenon lamp, and a metal halide lamp. Note that an exposure method other than the method using the negative mask may be employed. For example, the coating may be exposed to light by a direct patterning method in which ultra violet rays from a light source is irradiated only to the part of the coating which needs to be exposed to light. The light source used for the direct patterning method is selected from a group consisting of: for example, a high pressure mercury lamp; an ultra-high pressure mercury lamp; a metal halide lamp; a g-line (wavelength of 436 nm); an h-line (wavelength of 405 nm); an i-line (wavelength of 365 nm); and two or more combinations of the g-line, the h-line, and the i-line.

Subsequently, the coating undergoes a development process in order to remove the unexposed part of the coating. In the development process, an appropriate developer depending on the composition of the composition (P) may be used. The developer is: for example, an alkaline aqueous solution which contains at least one of an alkali metal salt and an alkali metal hydroxide; or an organic amine. More specifically, the alkaline aqueous solution contains at least one kind of compound selected from a group consisting of, for example, sodium carbonate, potassium carbonate, ammonium carbonate, sodium hydrogen carbonate, potassium hydrogen carbonate, ammonium hydrogen carbonate, sodium hydroxide, potassium hydroxide, ammonium hydroxide, tetramethylammonium hydroxide, and lithium hydroxide. A solvent of the alkaline aqueous solution may be water alone, or a mixture of water and a hydrophilic organic solvent such as lower alcohols. The organic amine contains at least one compound selected from a group consisting of, for example, monoethanol amine, diethanol amine, triethanol amine, monoisopropanol amine, diisopropanol amine, and triisopropanol amine.

Subsequently, the coating after the development process is cured by heating. Due to this, the solder resist layer can have a more matte surface. The coating is heated, for example, at a heating temperature within a range of 120 to 200° C. for 30 to 120 minutes. Curing the coating by heating under the above condition improves properties such as strength, hardness, and chemical resistance of the solder resist layer. If necessary, the coating may be further irradiated with ultra violet rays before heating, after heating, or before and after heating. In this case, photocuring of the coating further proceeds.

By the method as described above, the solder resist layer including the cured product of the composition (P) is formed on the core material. Accordingly, the printed wiring board including the solder resist layer is obtained.

In the present embodiment, as explained above, the solder resist layer formed with the composition (P) can have a matte surface. Due to this, for example, glossiness of less than or equal to 40 on a surface of the solder resist layer formed by a method including the application method as above described can be even achieved. When glossiness of a surface of the solder resist layer is less than or equal to 40, solder bridging caused by solder adhering to the solder resist layer during solder reflow can be prevented. Further, when the solder resist layer is black, light emitted from a light-emitting diode mounted on the printed wiring board including the black solder resist layer can be perceived more brightly due to the black solder resist layer.

EXAMPLES

1. Preparations of Carboxyl Group-Containing Resin Solutions (1) Carboxyl Group-Containing Resin Solution A 80 parts by mass of methacrylic acid, 80 parts by mass of methyl methacrylate, 20 parts by mass of styrene, 20 parts by mass of n-butyl methacrylate, 430 parts by mass of dipropylene glycol monomethyl ether, and 5 parts by mass of azobisisobutyronitrile were added to a four-neck flask equipped with a reflux condenser, a thermometer, a glass tube for nitrogen-substitution, and a stirrer. A mixture in the four-neck flask was heated at 75° C. for 5 hours under a nitrogen gas stream for a polymerization reaction to proceed, resulting in a 32% copolymer solution.

0.1 parts by mass of hydroquinone, 64 parts by mass of glycidyl methacrylate, and 0.8 parts by mass of dimethylbenzylamine were added to the copolymer solution and then the mixture was heated at 80° C. for 24 hours for an addition reaction to proceed. As a result, a 38 weight % solution of a compound which has a carboxyl group and an ethylene-based unsaturated group and whose acid value of a solid component was 105 mgKOH/g was obtained. This solution was used as the carboxyl group-containing resin solution A.

(2) Carboxyl Group-Containing Resin Solution B 30 parts by mass of methyl methacrylate, 70 parts by mass of glycidyl methacrylate, 100 parts by mass of diethylene glycol monoethyl ether acetate, 0.2 parts by mass of lauryl mercaptan, and 5 parts by mass of azobisisobutyronitrile were added to a four-neck flask equipped with a reflux condenser, a thermometer, a glass tube for nitrogen-substitution, and a stirrer. A mixture in the four-neck flask was heated at 80° C. for 5 hours under a nitrogen gas stream for a polymerization reaction to proceed, resulting in a 50% copolymer solution.

0.05 parts by mass of hydroquinone as a polymerization inhibitor, 37 parts by mass of acrylic acid, and 0.2 parts by mass of dimethylbenzylamine were added to the copolymer solution and then the mixture was heated at 100° C. for 24 hours for an addition reaction to proceed. Subsequently, 45 parts by mass of tetrahydro phthalic acid anhydride and 79 parts by mass of diethylene glycol monoethyl ether acetate were further added to the mixture which was then heated at 100° C. for 3 hours. As a result, a 50 weight % solution of a compound which has a carboxyl group and an ethylene-based unsaturated group and whose acid value of a solid component was 95 mgKOH/g was obtained. This solution was used as the carboxyl group-containing resin solution B.

(3) Carboxyl Group-Containing Resin Solution C

An acid-modified epoxy acrylate solution (manufactured by SHOWA DENKO K.K., Ripoxy PR-300CP, concentration of 65%, acid value of a solid component being 78 mgKOH/g) was prepared as the carboxyl group-containing resin solution C.

2. Preparations of Examples 1 to 17 and Comparative Examples 1 to 10

Mixtures obtained by mixing components listed in "Compositions" of following Tables 1 to 4 were kneaded using a three-roll to obtain solder resist compositions of examples 1 to 17 and comparative examples 1 to 10. Note that details of the components listed in the tables are as following.

Photopolymerization initiator (IRGACURE 907): 2-methyl-1-(4-methyl thiophenyl)-2-morpholino propan-1-one, manufactured by BASF, item No. IRGACURE 907.

Photopolymerization initiator (DETX): 2,4-diethyl thioxanethen-9-one.

Coloring agent 1: phthalocyanine green, manufactured by BASF, item No. Heliogen Green K8730.

Coloring agent 2: perylene black, manufactured by BASF, item No. Paliogen Black S0084.

Epoxy compound YDC-1312: a hydroquinone epoxy compound represented by formula (1) (2,5-di-tert-butylhydroquinone diglycidyl ether), manufactured by Nippon Steel & Sumikin Chemical Co., Ltd., item No. YDC-1312.

75% solution of epoxy compound EPICLON N-665: cresol novolac epoxy resin, manufactured by DIC Corporation, item name EPICLON N-665, softening point of 64 to 72° C.

Epoxy compound TGIC: triglycidyl isocyanurate (1,3,5-tris(2,3-epoxypropyl)-1,3,5-triazine-2,4,6(1H,3H,5H)-trione).

Barium sulfate: manufactured by SAKAI CHEMICAL INDUSTRY CO., LTD., item No. BARIACE B31.

Deglossing material: amorphous silicon dioxide, manufactured by W. R. GRACE JAPAN K.K., item No. SYLOID ED-41.

Organic solvent: diethylene glycol monomethyl ether acetate, manufactured by JAPAN CHEMTECH LTD., item No. D.O.A.

Photopolymerizable monomer DPHA: dipentaerythritol hexaacrylate, manufactured by Nippon Kayaku Co., Ltd.

Defoamer: manufactured by Shin-Etsu Chemical Co., Ltd., item No. KS-66.

Melamine: manufactured by NISSAN CHEMICAL INDUSTRIES, Ltd., fine powder melamine.

3. Evaluation Tests (1) Preparations of Test Pieces

A glass epoxy copper-clad laminated plate including a copper foil with thickness of 35 μm was prepared. A conductive wiring was formed by etching on the glass epoxy copper-clad laminated plate to obtain a core material. A surface of the obtained core material was entirely coated with the solder resist composition by a screen printing method, which was then dried by heating at 80° C. for 20 minutes to obtain a coating with thickness of 20 μm. With a negative mask placed directly on the coating, the negative mask was irradiated with ultraviolet rays using an exposing device equipped with a metal halide lamp, and accordingly the coating was selectively exposed to light with 450 mJ/cm$^2$ of exposure. Then, the negative mask was removed from the coating, and the coating was developed with a sodium carbonate aqueous solution so that a part of the coating, which was cured due to exposure to light, remained as a solder resist layer on a printed wiring board. The solder resist layer was further heated at 150° C. for 60 minutes and thermosetted. As a result, a test piece including the solder resist layer was obtained.

Following evaluation tests were carried out for each test piece.

(2) Evaluation of Low Tackiness

In preparation of each test piece, when the negative mask was removed from the coating after exposure to light, peeling resistance between the coating and the negative mask and a condition of the coating after removal of the negative mask were observed. The results were evaluated as follows.

A: No stickiness was observed when the coating before exposure to light was touched with a finger, and no traces of the negative mask was observed on the coating after removal of the negative mask succeeding to exposure to light.

B: Slight stickiness was observed when the coating before exposure to light was touched with a finger, and traces of the negative mask were observed on the coating after removal of the negative mask succeeding to exposure to light.

C: Conspicuous stickiness was observed when the coating before exposure to light was touched with a finger, and the coating was damaged after removal of the negative mask succeeding to exposure to light.

(3) Evaluation of Photosensitivity (Remained Steps)

A test mask for exposure to light (Step Tablet PHOTEC 21-steps manufactured by Hitachi Chemical Co., Ltd.) was directly placed and attached by low pressure adhesion on the coating formed in each example and comparative example. Then, the coating was irradiated with ultraviolet rays with irradiation energy density of 450 mJ/cm$^2$ through the test mask, using a both-side exposing device of low pressure adhesion type manufactured by ORC Manufacturing Co., Ltd. (model No. ORC HMW680GW) equipped with a metal halide lamp. The coating was then developed with a developer (a sodium carbonate aqueous solution with concentration of 1 weight %). Photosensitivity of the coating was evaluated in terms of the number of remained steps.

(4) Evaluation of Glossiness

Mirror surface glossiness with a measuring angle of 60° of the solder resist layer of each test piece was measured using "GLOSS CHECKER" manufactured by HORIBA, Ltd., conforming to JIS Z8741.

(5) Evaluation of Solder Heat Resistance

A flux was applied on each test piece using LONCO 3355-11 (a water-soluble flux manufactured by London Chemical Co., Inc.). Succeedingly, each test piece was dipped in a melted solder bath at 260° C. for 10 seconds and then rinsed with water, which is defined as one process. After the process was carried out 3 times, surface appearance of the solder resist layer was observed. The results were evaluated as follows.

A: No abnormality was observed.

B: Very slight change was observed.

C: Slight change was observed.

D: Significant change such as peeling was observed in the solder resist layer.

(6) Evaluation of Heat Crack Resistance

A printed wiring board including a copper conductive wiring with thickness of 25 μm was prepared. A solder resist layer was formed on the printed wiring board under the same conditions as the above described preparations of test pieces.

A flux was applied on the solder resist layer on the printed wiring board using LONCO 3355-11 (a water-soluble flux manufactured by London Chemical Co., Inc.). Succeedingly, the printed wiring board was dipped in a melted solder bath at 280° C. for 10 seconds and then rinsed with water, which is defined as one process. After the process was carried out 3 times, surface appearance of the solder resist layer was observed. The results were evaluated as follows.

A: No crack (breakage) was observed in the solder resist layer.

B: Slight crack was observed in the solder resist layer near an interface between the solder resist layer and the conductive wiring.

C: Crack was observed clearly in the solder resist layer.

(7) Evaluation of Plating Resistance

Each test piece was plated using a commercially available electroless nickel plating bath and a commercially available electroless gold plating bath, and plating of the each test piece and adhesiveness of the solder resist layer was observed. Also, peeling test was carried out on the solder resist layer using a cellophane adhesion tape, and adhesiveness of the solder resist layer after plating was observed. The results were evaluated as follows.

A: None of change in appearance due to plating, peeling of the solder resist layer after the tape was peeled, and intrusion of plating was observed.

B: Change in appearance due to plating and peeling of the solder resist layer after the tape was peeled were not observed, but only slight intrusion of plating at a tip of the solder resist layer was observed.

C: Change in appearance due to plating was not observed, but peeling of the solder resist layer after the tape was peeled was partially observed.

D: Floating of the solder resist layer after plating and peeling of the solder resist layer after the tape was peeled were observed.

(8) Evaluation of Adhesiveness

Conforming to a test method of JIS D0202, the solder resist layer of each test piece was cross-cut into a checker board pattern and peeling test using a cellophane adhesion tape was carried out. The solder resist layer after peeling test was observed visually. The results were evaluated as following.

A: No change was observed in all of 100 cross-cut sections.

B: Slight floating of the solder resist layer was observed in one of 100 cross-cut sections.

C: Peeling of the solder resist layer was observed in 2 to 10 of 100 cross-cut sections.

D: Peeling of the solder resist layer was observed in 11 to 100 of 100 cross-cut sections.

(9) Evaluation of Electric Corrosion Resistance

An evaluation board was prepared in the same manner as the above test piece except for using a comb pattern electrode B coupon of IPC B-25 as a core material. Bias voltage of DC 100 V was applied on the comb pattern electrode of the evaluation board, and the evaluation board was kept in an atmosphere of 90% R.H. at 40° C. for 500 hours. Subsequently, it was observed whether or not migration occurred. The results were evaluated as follows.

A: No migration was observed.

B: Slight migration was observed.

C: Obvious migration was observed.

(10) Evaluation of Pressure Cooker Test Resistance (PCT Resistance)

Each test piece was kept in an atmosphere of 100% RH at 121° C. under pressure of 2 atm (202.65 kPa) for 8 hours. Then, surface appearance of the solder resist layer of each test piece was observed and peeling test was carried out on the solder resist layer using a cellophane adhesion tape. The results were evaluated as follows.

A: Only slight discoloration was observed in the solder resist layer, and no peeling of the solder resist layer after the peeling test using a cellophane adhesion tape was observed.

B: Discoloration was observed in the solder resist layer, but no peeling of the solder resist layer after the peeling test using a cellophane adhesion tape was observed.

C: Discoloration was observed in the solder resist layer, and peeling of the solder resist layer after the peeling test using a cellophane adhesion tape was observed.

The results of the above evaluations are shown in "Evaluations" of following Tables 1 to 4.

Note that "E/A ratio" in Tables 1 to 4 is a ratio of an equivalent weight of epoxy groups in all the contained epoxy compound to 1 equivalent of carboxyl groups in the contained carboxyl group-containing resin in the solder resist composition. Also, "YDC percentage" in Tables 1 to 4 is a percentage by weight of the powdery hydroquinone epoxy compound with respect to a total amount of the contained carboxyl group-containing resin, the contained thermosetting component, and the contained photopolymerizable component in the solder resist composition.

TABLE 1

| | | Examples | | | | | |
|---|---|---|---|---|---|---|---|
| | | 1 | 2 | 3 | 4 | 5 | 6 |
| Compositions/ parts by mass | Carboxyl group-containing resin solution A | 80 | 80 | 80 | 80 | — | — |
| | Carboxyl group-containing resin solution B | — | — | — | — | 80 | 30 |
| | Carboxyl group-containing resin solution C | — | — | — | — | — | 50 |
| | Photopolymerization initiator (IRGACURE 907) | 8 | 8 | 8 | 8 | 8 | 8 |
| | Photopolymerization initiator (DETX) | 1 | 1 | 1 | 1 | 1 | 1 |
| | Coloring agent 1 | 0.7 | 0.7 | — | — | — | — |
| | Coloring agent 2 | — | — | 4 | 4 | 4 | 4 |
| | Epoxy compound YDC-1312 | 20 | 20 | 20 | 20 | 20 | 20 |
| | 75% solution of epoxy compound EPICLON N-665 | 10 | 10 | 10 | 10 | 10 | 10 |
| | Epoxy compound TGIC | — | — | — | — | — | — |
| | Barium sulfate | 45 | 45 | 45 | 45 | 45 | 45 |
| | Deglossing agent | — | 6 | — | 6 | 6 | 6 |
| | Organic solvent | 5 | 10 | 5 | 12 | 12 | 12 |
| | Photopolymerizable monomer | 10 | 10 | 10 | 10 | 10 | 10 |
| | Defoamer | 2 | 2 | 2 | 2 | 2 | 2 |
| | Melamine | 2 | 2 | 2 | 2 | 2 | 2 |
| Evaluations | Low tackiness | A | A | A | A | A | A |
| | Photosensitivity | 9 | 11 | 10 | 12 | 8 | 9 |
| | Glossiness | 32 | 5 | 31 | 3 | 4 | 3 |
| | Solder heat resistance | A | A | A | A | B | A |
| | Heat crack resistance | A | A | A | A | A | A |
| | Plating resistance | A | A | A | A | A | A |
| | Adhesiveness | A | A | A | A | A | A |
| | Electric corrosion resistance | A | A | A | A | A | A |
| | PCT resistance | A | B | A | B | B | B |
| | E/A | 2.64 | 2.64 | 2.64 | 2.64 | 2.22 | 2.13 |
| | YDC percentage | 29.46 | 29.46 | 29.46 | 29.46 | 25.81 | 23.53 |

TABLE 2

| | | Examples | | | | | | |
|---|---|---|---|---|---|---|---|---|
| | | 7 | 8 | 9 | 10 | 11 | 12 | 13 |
| Compositions/ parts by mass | Carboxyl group-containing resin solution A | — | — | 80 | — | — | — | — |
| | Carboxyl group-containing resin solution B | — | — | — | — | — | — | — |
| | Carboxyl group-containing resin solution C | 80 | 80 | — | 80 | 80 | 80 | 80 |
| | Photopolymerization initiator (IRGACURE 907) | 8 | 8 | 8 | 8 | 8 | 8 | 8 |
| | Photopolymerization initiator (DETX) | 1 | 1 | 1 | 1 | 1 | 1 | 1 |
| | Coloring agent 1 | — | — | — | 0.7 | — | — | — |
| | Coloring agent 2 | 4 | 4 | 4 | — | 4 | 4 | 4 |
| | Epoxy compound YDC-1312 | 20 | 20 | 20 | 20 | 14 | 30 | 14 |
| | 75% solution of epoxy compound EPICLON N-665 | 10 | 10 | — | — | 10 | 10 | — |
| | Epoxy compound TGIC | — | — | — | — | — | — | 6 |
| | Barium sulfate | 45 | 45 | 45 | 45 | 45 | 45 | 45 |
| | Deglossing agent | — | 6 | — | — | — | — | 4 |
| | Organic solvent | 12 | 12 | 12 | 12 | 5 | 20 | 17 |
| | Photopolymerizable monomer | 10 | 10 | 10 | 10 | 10 | 10 | 10 |

TABLE 2-continued

|  |  | Examples |  |  |  |  |  |  |
|---|---|---|---|---|---|---|---|---|
|  |  | 7 | 8 | 9 | 10 | 11 | 12 | 13 |
|  | Defoamer | 2 | 2 | 2 | 2 | 2 | 2 | 2 |
|  | Melamine | 2 | 2 | 2 | 2 | 2 | 2 | 2 |
| Evaluations | Low tackiness | A | A | A | A | A | A | A |
|  | Photosensitivity | 9 | 9 | 11 | 12 | 9 | 13 | 13 |
|  | Glossiness | 29 | 3 | 15 | 18 | 40 | 10 | 8 |
|  | Solder heat resistance | A | A | B | A | A | A | A |
|  | Heat crack resistance | A | A | A | A | A | A | A |
|  | Plating resistance | A | A | A | A | A | A | A |
|  | Adhesiveness | A | A | A | A | A | A | A |
|  | Electric corrosion resistance | A | A | A | A | A | A | A |
|  | PCT resistance | A | B | A | A | A | A | A |
|  | E/A | 2.08 | 2.08 | 2.00 | 1.58 | 1.61 | 2.87 | 1.94 |
|  | YDC percentage | 22.35 | 22.35 | 33.11 | 24.39 | 16.77 | 30.15 | 17.07 |

TABLE 3

|  |  | Examples |  |  |  | Comparative examples |  |  |
|---|---|---|---|---|---|---|---|---|
|  |  | 14 | 15 | 16 | 17 | 1 | 2 | 3 |
| Compositions/ parts by mass | Carboxyl group-containing resin solution A | — | — | 50 | 10 | 80 | 80 | — |
|  | Carboxyl group-containing resin solution B | — | — | — | 40 | — | — | — |
|  | Carboxyl group-containing resin solution C | 80 | 80 | 30 | 30 | — | — | 80 |
|  | Photopolymerization initiator (IRGACURE 907) | 8 | 8 | 8 | 8 | 8 | 8 | 8 |
|  | Photopolymerization initiator (DETX) | 1 | 1 | 1 | 1 | 1 | 1 | 1 |
|  | Coloring agent 1 | 0.7 | 0.7 | — | — | 0.7 | 0.7 | — |
|  | Coloring agent 2 | — | — | 4 | 4 | — | — | 4 |
|  | Epoxy compound YDC-1312 | 14 | 14 | 14 | 20 | — | — | — |
|  | 75% solution of epoxy compound EPICLON N-665 | 10 | 10 | 10 | 10 | 10 | 10 | 10 |
|  | Epoxy compound TGIC | — | — | 6 | — | 14 | 14 | 14 |
|  | Barium sulfate | 45 | 45 | 45 | 45 | 45 | 45 | 45 |
|  | Deglossing agent | 6 | 8 | — | 3 | — | 12 | — |
|  | Organic solvent | 10 | 10 | 7 | 8 | 5 | 12 | 5 |
|  | Photopolymerizable monomer | 10 | 10 | 10 | 10 | 10 | 10 | 10 |
|  | Defoamer | 2 | 2 | 2 | 2 | 2 | 2 | 2 |
|  | Melamine | 2 | 2 | 2 | 2 | 2 | 2 | 2 |
| Evaluations | Low tackiness | A | A | A | A | A | A | A |
|  | Photosensitivity | 11 | 12 | 12 | 10 | 10 | 13 | 10 |
|  | Glossiness | 10 | 1 | 10 | 3 | 80 | 4 | 79 |
|  | Solder heat resistance | A | A | A | A | A | A | A |
|  | Heat crack resistance | A | A | A | A | C | C | B |
|  | Plating resistance | A | A | A | A | A | D | A |
|  | Adhesiveness | A | A | A | A | A | A | A |
|  | Electric corrosion resistance | A | A | A | A | A | C | A |
|  | PCT resistance | B | B | A | A | A | C | A |
|  | E/A | 1.61 | 1.61 | 2.82 | 2.21 | 3.12 | 3.12 | 2.46 |
|  | YDC percentage | 16.77 | 16.77 | 18.42 | 24.75 | 0 | 0 | 0 |

TABLE 4

|  |  | Comparative Examples |  |  |  |  |  |  |
|---|---|---|---|---|---|---|---|---|
|  |  | 4 | 5 | 6 | 7 | 8 | 9 | 10 |
| Compositions/ parts by mass | Carboxyl group-containing resin solution A | — | — | — | 10 | — | — | — |
|  | Carboxyl group-containing resin solution B | — | — | — | 40 | — | — | — |
|  | Carboxyl group-containing resin solution C | 80 | 80 | 80 | 30 | 80 | 80 | 80 |
|  | Photopolymerization initiator (IRGACURE 907) | 8 | 8 | 8 | 8 | 8 | 8 | 8 |
|  | Photopolymerization initiator (DETX) | 1 | 1 | 1 | 1 | 1 | 1 | 1 |

TABLE 4-continued

| | | Comparative Examples | | | | | | |
|---|---|---|---|---|---|---|---|---|
| | | 4 | 5 | 6 | 7 | 8 | 9 | 10 |
| | Coloring agent 1 | — | — | — | — | — | — | — |
| | Coloring agent 2 | 4 | 4 | 4 | 4 | 4 | 4 | 4 |
| | Epoxy compound YDC-1312 | 4 | 6 | 4 | — | — | 50 | 25 |
| | 75% solution of epoxy compound EPICLON N-665 | 10 | 20 | 10 | 10 | 10 | 10 | 65 |
| | Epoxy compound TGIC | 9 | — | 9 | 14 | 7 | — | — |
| | Barium sulfate | 45 | 45 | 45 | 45 | 45 | 45 | 45 |
| | Deglossing agent | — | — | 10 | — | 12 | — | — |
| | Organic solvent | 5 | 0 | 10 | 5 | 12 | 20 | 12 |
| | Photopolymerizable monomer | 10 | 10 | 10 | 10 | 10 | 10 | 10 |
| | Defoamer | 2 | 2 | 2 | 2 | 2 | 2 | 2 |
| | Melamine | 2 | 2 | 2 | 2 | 2 | 2 | 2 |
| Evaluations | Low tackiness | A | C | A | A | A | A | B |
| | Photosensitivity | 10 | 8 | 12 | 10 | 13 | 4 | cannot be developed |
| | Glossiness | 67 | 72 | 20 | 48 | 8 | 8 | 70 |
| | Solder heat resistance | A | A | A | A | A | C | A |
| | Heat crack resistance | A | A | A | B | B | C | A |
| | Plating resistance | A | A | C | A | D | C | A |
| | Adhesiveness | A | A | A | A | A | C | A |
| | Electric corrosion resistance | A | A | B | A | C | C | A |
| | PCT resistance | A | A | C | A | C | C | A |
| | E/A | 2.07 | 1.48 | 2.07 | 2.61 | 1.48 | 4.45 | 5.23 |
| | YDC percentage | 4.85 | 7.23 | 4.85 | 0 | 0 | 41.84 | 18.42 |

As apparent from the above, a liquid solder resist composition according to the first embodiment of the present invention contains a carboxyl group-containing resin (A), a thermosetting component (B), a photopolymerizable component (C), a photopolymerization initiator (D), and a coloring agent (E), the thermosetting component (B) contains an epoxy compound (B1), the epoxy compound (B1) contains a powdery epoxy compound (B11) represented by following formula (1), an amount of the epoxy compound (B11) with respect to a total amount of the carboxyl group-containing resin (A), the thermosetting component (B), and the photopolymerizable component (C) is within a range of 15 to 40 weight %, and an equivalent weight of epoxy groups in the epoxy compound (B1) with respect to 1 equivalent of carboxyl groups in the carboxyl group-containing resin (A) is within a range of 1.0 to 5.0 equivalent.

[Chemical 3]

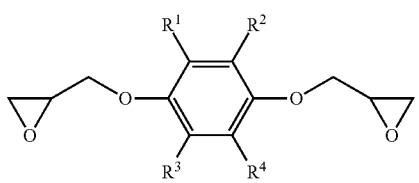

(1)

In the first embodiment, a solder resist layer formed with the liquid solder resist composition can have a matte surface due to resin components in the liquid solder resist composition.

In the liquid solder resist composition according to the second embodiment realized in combination with the first embodiment, the epoxy compound (B1) may further contain an epoxy compound (B12) other than the epoxy compound (B11).

In the liquid solder resist composition according to the third embodiment realized in combination with the second embodiment, the epoxy compound (B12) may have a melting point or softening point higher than or equal to 60° C.

In the third embodiment, tackiness of a coating formed with the liquid solder resist composition can be reduced.

In the liquid solder resist composition according to the fourth embodiment realized in combination with any one of the first to third embodiments, the coloring agent (E) may contain a black coloring agent (E1).

In the fourth embodiment, a black solder resist layer having a matte surface can be formed with the liquid solder resist composition.

In the liquid solder resist composition according to the fifth embodiment realized in combination with the fourth embodiment, the black coloring agent (E1) may contain perylene.

In the fifth embodiment, the black coloring agent (E1) is less likely to inhibit curing of the solder resist composition while the liquid solder resist composition being exposed to light. Accordingly, even though the liquid solder resist composition contains the black coloring agent (E1), the liquid solder resist composition can have good photocurability. Due to this, the liquid solder resist composition can have high developability.

In the liquid solder resist composition according to the sixth embodiment realized in combination with any one of the first to fifth embodiments, the carboxyl group-containing resin (A) may contain a novolac-based carboxyl group-containing resin (A1).

In the sixth embodiment, the solder resist layer can have good heat resistance and moisture resistance.

A printed wiring board according to the seventh embodiment includes the solder resist layer including a cured product of the liquid solder resist composition according to any one of the first to sixth embodiments.

In the seventh embodiment, the printed wiring board including the solder resist layer which has a matte surface can be obtained.

The invention claimed is:

1. A liquid solder resist composition comprising:
   a carboxyl group-containing resin (A);
   a thermosetting component (B);
   a photopolymerizable component (C);
   a photopolymerization initiator (D); and
   a coloring agent (E),
   the thermosetting component (B) containing an epoxy compound (B1),
   the epoxy compound (B1) containing a powdery epoxy compound (B11) represented by following formula (1),

[Chemical 1]

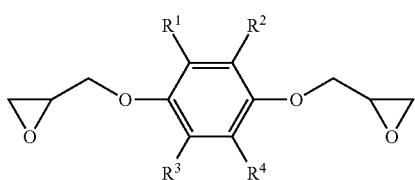

(1)

$R^1$, $R^2$, $R^3$, and $R^4$ in the formula (1) being independently a methyl group, a hydrogen atom, or a t-butyl group,
   the coloring agent (E) consisting of a single perylene black,
   an amount of the epoxy compound (B11) with respect to a total amount of the carboxyl group-containing resin (A), the thermosetting component (B), and the photopolymerizable component (C) being within a range of 15 to 40 weight %, and
   an equivalent weight of epoxy groups in the epoxy compound (B1) with respect to 1 equivalent of carboxyl groups in the carboxyl group-containing resin (A) being within a range of 1.0 to 5.0 equivalent.

2. The liquid solder resist composition according to claim 1, wherein
   the epoxy compound (B1) further contains an epoxy compound (B12) other than the epoxy compound (B11).

3. The liquid solder resist composition according to claim 2, wherein
   the epoxy compound (B12) has a melting point or softening point higher than or equal to 60 ° C.

4. The liquid solder resist composition according to claim 1, wherein
   the carboxyl group-containing resin (A) contains a novolac-based carboxyl group-containing resin (A1).

5. A printed wiring board, comprising a solder resist layer including a cured product of the liquid solder resist composition according to claim 1.

* * * * *